US010025153B2

(12) United States Patent
Feng

(10) Patent No.: US 10,025,153 B2
(45) Date of Patent: Jul. 17, 2018

(54) ARRAY SUBSTRATE AND REPAIRING METHOD THEREOF, TESTING METHOD THEREOF, MANUFACTURING METHOD THEREOF, DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventor: Wei Feng, Beijing (CN)

(73) Assignees: BOE TECHNOLOGY GROUP CO., LTD., Beijing (CN); HEFEI XINSHENG OPTOELECTRONICS TECHOLOGY CO., LTD., Anhui (CN)

( * ) Notice: Subject to any disclaimer, the term of this patent is extended or adjusted under 35 U.S.C. 154(b) by 160 days.

(21) Appl. No.: 15/096,706

(22) Filed: Apr. 12, 2016

(65) Prior Publication Data
US 2016/0358524 A1 Dec. 8, 2016

(30) Foreign Application Priority Data
Jun. 4, 2015 (CN) .......................... 2015 1 0309305

(51) Int. Cl.
G02F 1/1362 (2006.01)
G02F 1/13 (2006.01)
(Continued)

(52) U.S. Cl.
CPC .......... *G02F 1/136259* (2013.01); *G02F 1/13* (2013.01); *G09G 3/3648* (2013.01);
(Continued)

(58) Field of Classification Search
CPC ........... G09G 2330/08; G09G 2330/10; G09G 2330/12; G09G 2300/0426;
(Continued)

(56) References Cited

U.S. PATENT DOCUMENTS 5,303,074 A * 4/1994 Salisbury .............. G02F 1/1309
257/292
5,608,245 A * 3/1997 Martin .................. G02F 1/1309
250/370.08
(Continued)

FOREIGN PATENT DOCUMENTS

CN 101446724 A 6/2009
CN 101614916 A 12/2009
(Continued)

OTHER PUBLICATIONS

Office Action in Chinese Patent Application No. 201510309305.5, dated Dec. 9, 2016.
(Continued)

Primary Examiner — Darlene M Ritchie
(74) Attorney, Agent, or Firm — Brooks Kushman P.C.

(57) ABSTRACT

An array substrate provided by embodiments of the present disclosure includes a base substrate; a gate line pattern and a data line pattern formed on the base substrate; a gate insulating layer pattern formed between the gate line pattern and the data line pattern; and a spare line pattern formed on a same layer as the gate line pattern. The spare line pattern includes multiple spare lines which are substantially in parallel with the gate lines in the gate line pattern. Respective spare lines may be arranged at multiple rows of pixels defined by the gate line pattern and the data line pattern. And the respective spare lines and respective data lines in the data line pattern may have respective vertically overlapped regions.

20 Claims, 7 Drawing Sheets

(51) Int. Cl.
*G09G 3/36* (2006.01)
*H01L 27/12* (2006.01)
*H01L 21/768* (2006.01)

(52) U.S. Cl.
CPC ............ *G02F 2001/136263* (2013.01); *G02F 2001/136272* (2013.01); *G02F 2201/506* (2013.01); *G02F 2201/508* (2013.01); *G09G 2330/08* (2013.01); *G09G 2330/12* (2013.01); *H01L 21/76894* (2013.01); *H01L 27/1244* (2013.01); *H01L 2251/568* (2013.01)

(58) Field of Classification Search
CPC ......... G02F 2201/506; G02F 2201/508; G02F 1/136259; G02F 2001/136263; G02F 2001/136268; G02F 2001/136272; G02F 1/136286; G02F 2001/13629; H01L 21/76894; H01L 2251/568; H01L 27/1244
See application file for complete search history.

(56) References Cited

U.S. PATENT DOCUMENTS

| | | | | |
|---|---|---|---|---|
| 6,822,701 | B1* | 11/2004 | Kasahara | G02F 1/136259 349/192 |
| 6,856,374 | B1* | 2/2005 | Ozaki | G02F 1/136259 349/192 |
| 9,502,438 | B2* | 11/2016 | Kim | G02F 1/136259 |
| 2001/0028429 | A1* | 10/2001 | Wu | G02F 1/1309 349/139 |
| 2006/0012728 | A1* | 1/2006 | Watamura | G02F 1/136259 349/43 |
| 2007/0045625 | A1* | 3/2007 | Chen | G02F 1/136259 257/59 |
| 2007/0284578 | A1 | 12/2007 | Yoon | |
| 2009/0085034 | A1* | 4/2009 | Choi | G02F 1/136259 257/59 |
| 2009/0102992 | A1* | 4/2009 | Chung | G09G 3/3648 349/37 |
| 2009/0167976 | A1* | 7/2009 | Chung | G02F 1/136259 349/54 |
| 2009/0322978 | A1* | 12/2009 | Peng | G02F 1/136259 349/54 |
| 2010/0245679 | A1* | 9/2010 | Shohraku | G02F 1/136213 348/731 |
| 2013/0070003 | A1* | 3/2013 | Shohraku | G09G 3/3648 345/690 |
| 2014/0104530 | A1* | 4/2014 | Xi | G02F 1/136286 349/43 |
| 2014/0176891 | A1* | 6/2014 | Hisada | G02F 1/136209 349/139 |
| 2014/0184969 | A1* | 7/2014 | Ro | G02F 1/136286 349/43 |
| 2014/0247411 | A1* | 9/2014 | Kim | G02F 1/134363 349/46 |
| 2015/0243791 | A1* | 8/2015 | Itoh | H01L 27/3265 257/43 |
| 2016/0313614 | A1* | 10/2016 | Woo | G02F 1/133345 |

FOREIGN PATENT DOCUMENTS

| | | |
|---|---|---|
| CN | 101770122 A | 7/2010 |
| CN | 103217840 A | 7/2013 |
| CN | 103633101 A | 3/2014 |
| CN | 103745970 A | 4/2014 |
| JP | 2007-156338 A | 6/2007 |

OTHER PUBLICATIONS

Second Office Action for Chinese Application No. 201510309305.5, dated Jun. 29, 2017, 7 Pages.

* cited by examiner

ARRAY SUBSTRATE AND REPAIRING METHOD THEREOF, TESTING METHOD THEREOF, MANUFACTURING METHOD THEREOF, DISPLAY DEVICE

CROSS-REFERENCE TO RELATED APPLICATION

This application claims the benefit and priority of a Chinese Patent Application No. 201510309305.5 filed on Jun. 4, 2015, the disclosure of the above application is incorporated herein by reference.

FIELD

The present disclosure relates to the field of display technology, in particular to an array substrate and a repairing method thereof, a testing method thereof, a manufacturing method thereof, and a display device.

BACKGROUND

This section provides background information related to the present disclosure which is not necessarily prior art.

With development of display manufacturing technology, Liquid Crystal Display (LCD) technology has been developed rapidly, and has replaced traditional picture tube display and become the mainstream of future flat panel display. In the field of liquid crystal display technology, thin film transistor liquid crystal display TFT-LCD (thin film transistor liquid crystal display) with the advantage of its large size, highly integrated, powerful, flexible process, low cost is widely used in televisions, computers, mobile phones and other fields.

A display panel is a main component of TFT-LCD, which is generally formed by cell-aligning and assembling an array substrate and a color filter substrate and then perfusing liquid crystal. The array substrate in the display panel includes several gate lines and data lines. A switch scanning signal is provided by the gate line, a data scanning signal is provided by the data line, and the gate line and the data line are generally connected by a peripheral circuit lead wire. During production of the array substrate, the data line may be disconnected due to a production process or environment of a factory building, because of the complex production process. As such, a black line may be generated in a displayed picture, which significantly affects display quality of the picture. Structures of the array substrate and repairing processes in the related art cannot repair a defect such as disconnection of the data line rapidly and simply.

SUMMARY

This section provides a general summary of the disclosure, and is not a comprehensive disclosure of its full scope or all of its features.

An object of the present disclosure is to address a problem as described above.

According to a first aspect of the present disclosure, the present disclosure provides an array substrate, including: a base substrate; a gate line pattern and a data line pattern formed on the base substrate; a gate insulating layer pattern formed between the gate line pattern and the data line pattern; and a spare line pattern formed on a same layer as the gate line pattern. The spare line pattern may include a plurality of spare lines which are substantially in parallel with the gate lines in the gate line pattern, respective spare lines may be arranged at a plurality of rows of pixels defined by the gate line pattern and the data line pattern, and the respective spare lines and respective data lines in the data line pattern may have respective vertically overlapped regions.

Further, each of the spare lines may be arranged at each of the plurality of rows of pixels defined by the gate line pattern and the data line pattern.

Further, the gate insulating layer pattern may be formed over the gate line pattern and the spare line pattern, and the data line pattern may be formed on the gate insulating layer pattern. The array substrate may further include: a pixel electrode pattern formed on the gate insulating layer pattern; the pixel electrode pattern may include pixel electrode blocks corresponding to respective pixels, a passivation layer pattern formed over the pixel electrode pattern, and a common electrode pattern formed over the passivation layer pattern.

The respective spare lines in the spare line pattern and respective pixel electrode blocks located over the respective spare lines may have respective vertically overlapped regions, and tooling holes may be formed within the respective vertical overlapped regions on the passivation layer pattern.

The respective spare lines in the spare line pattern may extend to a bezel region of the array substrate and may be exposed at the bezel region.

Further, the array substrate may further include: an isolated electrode pattern formed over the passivation layer pattern. Respective isolated electrodes in the isolated electrode pattern may be isolated from common electrodes in the common electrode pattern, and may be connected to the respective pixel electrodes in the pixel electrode pattern via respective tooling holes in the passivation layer pattern.

Further, the spare lines in the spare line pattern each may include a spare line main body and a conductive strip connected to the spare line main body, the conductive strip being located at the bezel region and being exposed at the bezel region.

According to a second aspect of the present disclosure, the present disclosure provides a method of repairing the array substrate according to any of the embodiments as previously described. The method may include: when one data line in the array substrate is disconnected and is required to be repaired, melting a gate insulating layer at a vertically overlapped region between a segment of data line of the disconnected data line which is not connected to a data driven circuit and a spare line which has a vertically overlapped region with the segment of data line and is closest to the data driven circuit, and melting a gate insulating layer at a vertically overlapped region between the spare line and one data line which is adjacent to the disconnected data line, so that the segment of data line is connected to the adjacent data line via the spare line.

Further, the method may further include: when one data line and one gate line are short-circuited, melting the data line from a short circuit point, so that the data line is divided into two segments which are not connected to the gate line, and processing the two segments according to processing steps performed when the data line is disconnected.

According to a third aspect of the present disclosure, the present disclosure provides a method of testing the array substrate according to any of the embodiments as previously described. The method may include: when one pixel in the array substrate is required to be tested, melting gate insulating layer material at the tooling hole of the pixel, so that the pixel electrode at the tooling hole of the pixel is connected to the spare line under the pixel electrode.

According to a fourth aspect of the present disclosure, the present disclosure provides a method of manufacturing the array substrate according to any of the embodiments as previously described. The method may include: forming the gate line pattern and the data line pattern on the base substrate, and the gate insulating layer pattern between the gate line pattern and the data line pattern; and forming the spare line pattern on a same layer as the gate line pattern. The spare line pattern may include a plurality of spare lines which are substantially in parallel with the gate lines in the gate line pattern, respective spare lines may be arranged at a plurality of rows of pixels defined by the gate line pattern and the data line pattern, and the respective spare lines and respective data lines in the data line pattern may have respective vertically overlapped regions.

Further, the step of forming the spare line pattern on the same layer as the gate line pattern may include: forming the spare line pattern by a same process as that of forming the gate line pattern.

Further, when the array substrate has the isolated electrode pattern, the method may further include: forming the isolated electrode pattern by a same process as that of forming the common electrode pattern.

According to a fifth aspect of the present disclosure, the present disclosure provides a display device comprising the array substrate according to any of the embodiments as previously described.

The array substrate and the repairing method thereof provided by the disclosure may repair a data line disconnection defect rapidly when the defect occurs in the array substrate. In addition, the repairing process is relatively simple and is easy to be implemented.

Further aspects and areas of applicability will become apparent from the description provided herein. It should be understood that various aspects of this disclosure may be implemented individually or combination with one or more other aspects. It should also be understood that the description and specific examples herein are intended for purposed of illustration only and are not intended to limit the scope of the present disclosure.

DETAILED DESCRIPTION OF THE PREFERRED EMBODIMENTS

In order to make the objects, the technical solutions and the advantages of the present disclosure more apparent, the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Unless otherwise defined, any technical or scientific terms used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than being limited to physical or mechanical connection. Such words as "on/above", "under/below", "left" and "right" are merely used to represent relative position relationship, and when an absolute position of an object is changed, the relative position relationship will be changed too.

Hereinafter, various embodiments of the present disclosure will be described in detail with reference to the drawings.

First Embodiment

Figure 1:
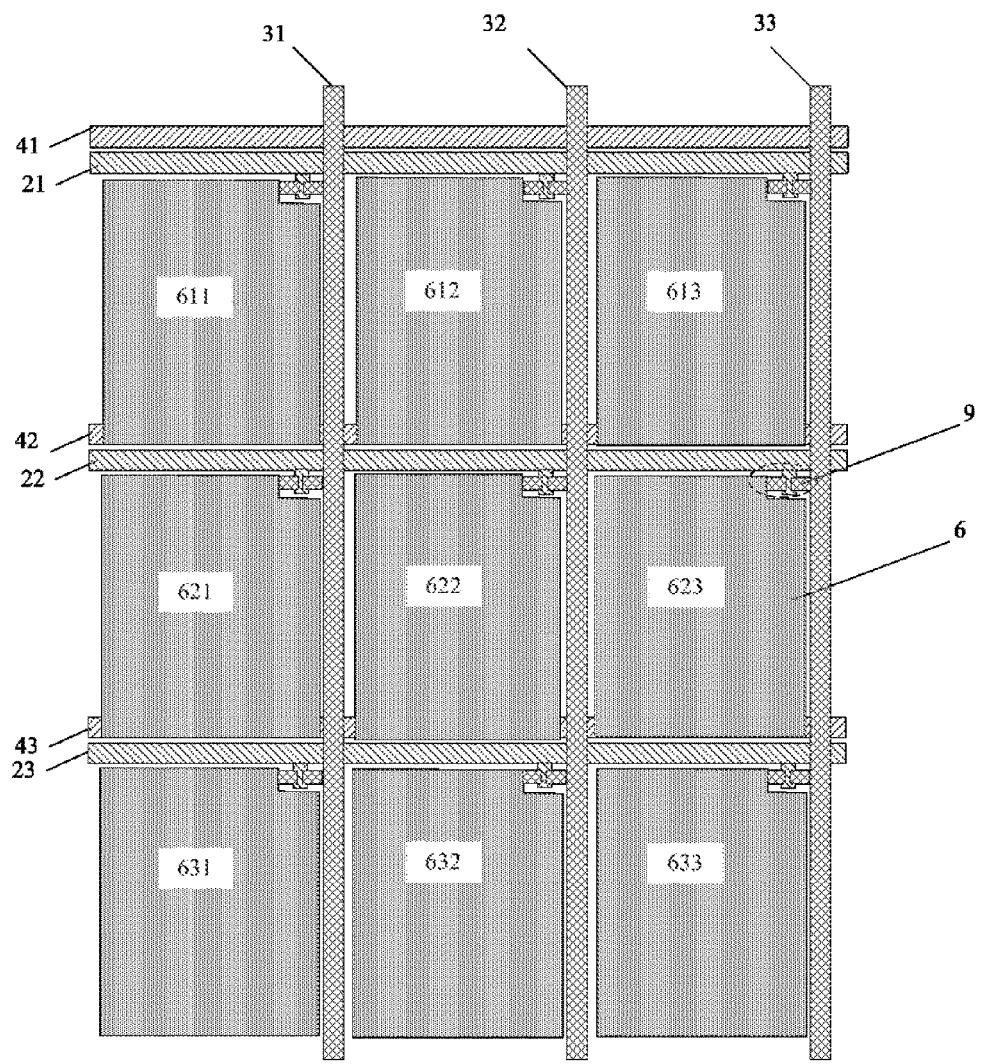
FIG. 1 is a schematic structure diagram of an array substrate provided by a first embodiment of the present disclosure.
Figure 4:
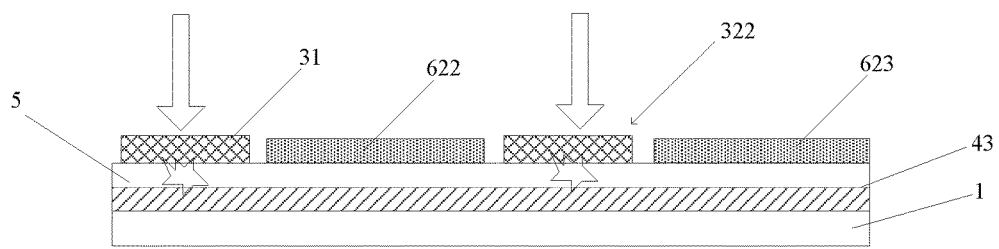
FIG. 4 is a schematic structure diagram of an array substrate provided by the first embodiment of the present disclosure.
Figure 6:
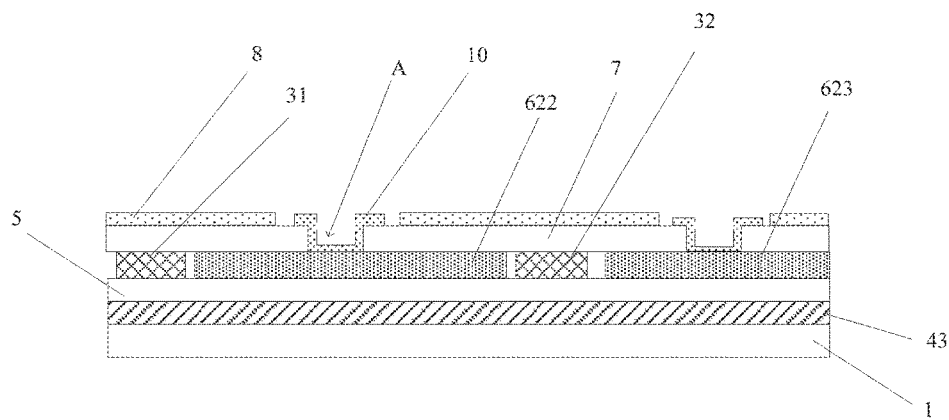
FIG. 6 is a schematic structure diagram of an array substrate provided by the second embodiment of the present disclosure.

A structure of an array substrate provided according to the first embodiment of the present disclosure may be shown in FIGS. 1 and 4. The array substrate includes: a base substrate 1 (as shown in FIG. 6); a gate line pattern and a data line pattern formed on the base substrate 1, where respective rows of gate lines 21, 22, 23 in the gate line pattern and respective columns of data lines 31, 32, 33 in the data line pattern are vertically intersected, dividing the array substrate into a plurality of pixels; and a spare line pattern formed on a same layer as the gate line pattern, the spare line pattern including a plurality of spare lines 41, 42, 43 which are substantially in parallel with the gate lines in the gate line pattern, wherein each of the spare lines is arranged at each of the plurality of rows of pixels, and the spare line and respective data lines connected to respective pixels in the row have respective vertically overlapped regions. In addition, a gate insulating layer 5 (as shown in FIG. 6) for isolating the gate line pattern and the spare line pattern from the data line pattern is also formed between the gate line pattern, the spare line pattern and the data line pattern.

As will be easily understood by the skilled in the art, the spare line and the data line having the vertically overlapped region means that projections of the spare line and the data line on the base substrate 1 are overlapped, while the spare line and the data line are not in a direct contact due to the gate insulating layer between the spare line and the data line.

For the array substrate in FIG. 1, the disconnection defect (Do) of the data line or a short circuit defect (DGs) between the data line and the gate line may be easily repaired when these defects occur. Hereinafter, description thereof will be illustrated in connection with FIGS. 2 and 3.

Figure 2:
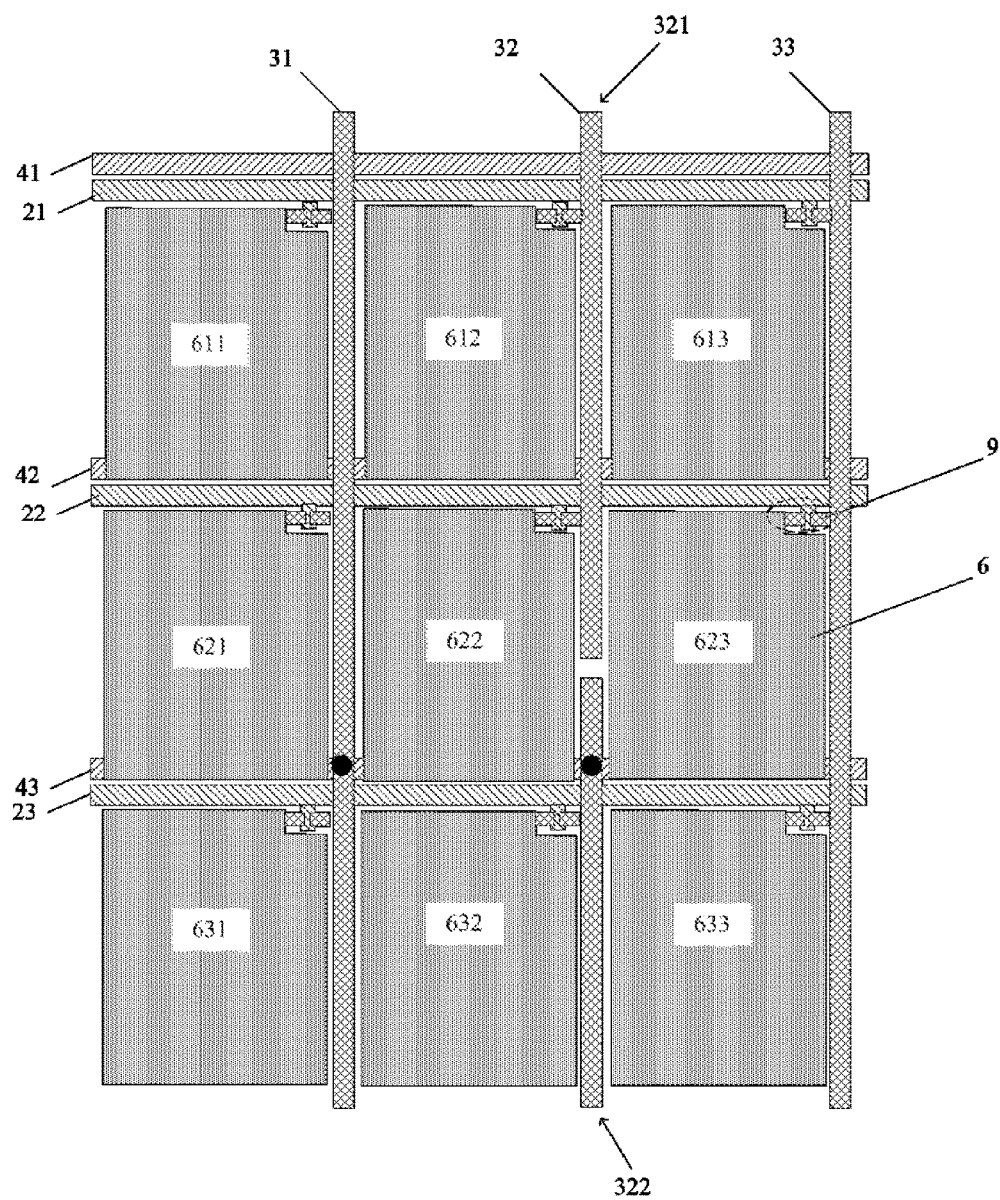
FIG. 2 is a schematic structure diagram of an array substrate provided by the first embodiment of the present disclosure.

As shown in FIG. 2, when the data line 32 is disconnected at a location between the spare line 42 and the spare line 43

(in which the spare line 41 is closer to a data driven circuit than the spare line 42, and the spare line 42 is closer to the data driven circuit than the spare line 43), the gate insulating layer at a vertically overlapped region between the spare line 43 and a data line segment 322 which is not connected to the data driven circuit may be melted, and the gate insulating layer at a vertically overlapped region between the spare line 43 and the data line 31 which is adjacent to the data line 32 may be melted, so that the data line segment 322 is connected to the spare line 43 at the vertically overlapped region of the spare line 43 (a solid black dot in FIG. 2 being used for representing a connection of two lines), and the data line 31 is also connected to the spare line 43. As such, the segment of the data line 32 which is not connected to the data driven circuit after the data line 32 is disconnected may be connected to the adjacent data line 31. Since gray scales of adjacent rows of pixels are generally approximate to each other, quality of a displayed picture may not be disadvantageously affected considerably.

Figure 3:
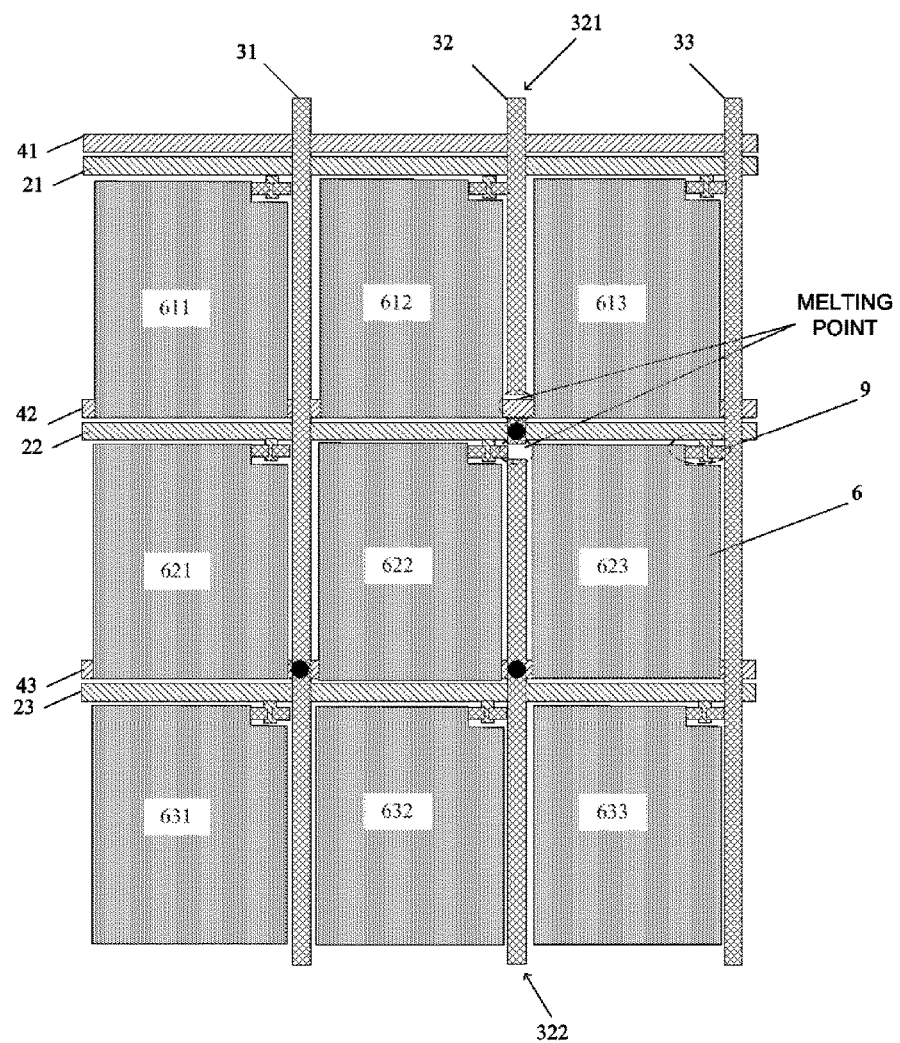
FIG. 3 is a schematic structure diagram of an array substrate provided by the first embodiment of the present disclosure.

With reference to FIG. 3, when the data line 32 and the gate line 22 are short-circuited, the data line 32 may be melted into two segments 321 and 322 which are not connected to the gate line 22. Then, the data line segment 322 which is not connected to the data driven circuit may be connected to the adjacent data line 31 via the spare line 43 according to the repairing method of the data line 32, which will not be described in detail here.

With reference to FIG. 4, in a particular implementation, the gate insulating layer pattern 5 at the overlapped region between the data line segment 322, the data line 31 and the spare line 43 may be melted by laser bombardment, so that the data line segment 322 and the data line 31 may be connected to the spare line 43.

As will be easily understood by the skilled in the art, although FIG. 1 shows a case in which the spare line and the gate line are closely adjacent to each other, the spare line may also be arranged at other positions in the pixel in practical applications, e.g., at a central position of the pixel, and a corresponding technical solution may also achieve the basic object of the present disclosure, which should also fall into the protection scope of the present disclosure accordingly.

As will be easily understood by the skilled in the art, although FIGS. 1 and 4 show a case in which the data line is arranged over the spare line and the gate line (a light emitting direction), the spare line and the gate line may also be formed over the data line in practical applications. A position relationship of the spare line and the gate line relative to the data line is not limited in the present disclosure, as long as the technical problem to be solved by the present disclosure can be solved.

Additionally, as shown in FIGS. 1-3, a TFT structure and a pixel electrode pattern are also formed in respective pixels. Particular structures of the TFT structure connecting respective pixel electrode blocks (611-613, 621-623, 631-633) in the pixel electrode pattern, the gate line and the data line may refer to related art, the description of which will not be illustrated in detail here.

The array substrate and the repairing method of the array substrate provided by the first embodiment of the present disclosure may easily complete the repair of the Do defect and the DGs defect occurring in the array substrate. As will be easily understood by the skilled in the art, although a first embodiment of the present disclosure illustrates an example in which one spare line is arranged at each row of pixels, the spare line may be arranged at some rows of pixels periodically in practical applications. In this case, the above repairing method may also be applied for repairing, and the corresponding technical solution should also fall into the protection scope of the present disclosure.

Second Embodiment

In the H-ADS (High Aperture ADvanced Super Dimension Switch) array substrate of the related art, since the pixel electrodes are manufactured under the common electrode layer, a test terminal cannot be connected to the pixel electrode, and thus a corresponding electrical performance testing cannot be implemented. In order to solve such a problem, the second embodiment of the present disclosure provides a novel H-ADS array substrate.

Figure 5:
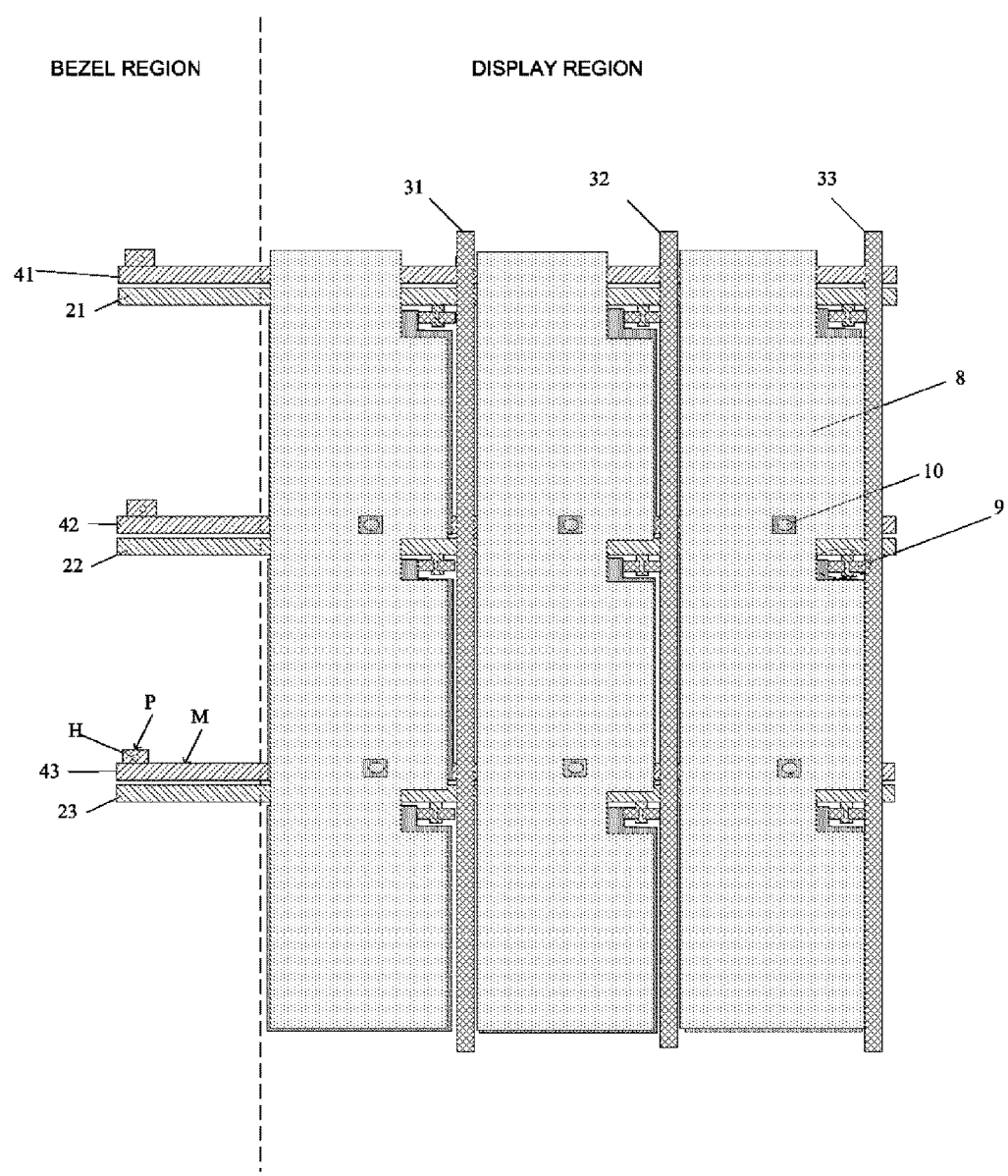
FIG. 5 is a schematic structure diagram of an array substrate provided by a second embodiment of the present disclosure.

As shown in FIGS. 5 and 6, the array substrate provided by the second embodiment is an H-ADS array substrate. Compared to the array substrate provided by the first embodiment, the H-ADS array substrate further includes: a passivation layer pattern 7 formed over the pixel electrode pattern, and a common electrode pattern 8 formed over the passivation layer pattern 7. The respective spare lines in the spare line pattern and the respective pixel electrode blocks located over the respective spare lines have respective vertically overlapped regions, and tooling holes indicated by a sign "A" are formed on the passivation layer pattern 7 at positions corresponding to the respective vertical overlapped regions. In addition, the H-ADS array substrate includes an isolated electrode pattern 10 formed over the passivation layer pattern 7, and the isolated electrode pattern 10 is connected to the pixel electrode block under the isolated electrode pattern 10 via the tooling hole indicated by a sign "A".

Here, the vertically overlapped region is substantially identical with the vertically overlapped region described in the first embodiment, the description thereof thus is omitted here.

Additionally, as shown in FIG. 5, the respective spare lines in the spare line pattern extend to a bezel region of the array substrate. The spare lines are exposed at the bezel region and may be connected to a testing electrode. Further, each spare line includes a spare line main body M, and a conductive strip P on which a connection hole H is formed.

In this embodiment of the present disclosure, since respective spare lines in the spare line pattern extend to the bezel region and are exposed at the bezel region, a testing pin may be connected onto the spare line of the bezel region in order to implement electrical performance testing on any of pixels connected to the spare line.

Hereinafter, an electrical performance testing process on a display device including the array substrate provided by the second embodiment of the present disclosure will be described in connection with FIG. 6. Assuming that when it is required to test the pixel corresponding to the pixel electrode block 622 in the pixel electrode pattern, the gate insulating layer material at the tooling hole indicated by a sign "A" corresponding to the pixel electrode block 622 may be melted, so that the pixel electrode block 622 is connected to the spare line 43 through the tooling hole indicated by a sign "A". Then the testing pin may be inserted into the connection hole H on the conductive strip P of the spare line 43, so that the testing pin is connected to the corresponding pixel electrode; then a corresponding testing signal may be applied onto the gate line and the data line, so as to implement testing on the pixel electrode block 622.

As will be easily understood by the skilled in the art, both the conductive strip and the tooling hole arranged according to this embodiment of the present disclosure are used for facilitating testing personnel to conveniently connect the testing pin to the testing line. In terms of implementing the testing on the pixel electrode blocks, neither the conductive strip nor the tooling hole as described above is an essential element.

Also in this embodiment of the present disclosure, there may be sufficient conductive material to be filled into a via hole generated by melting the gate insulating layer material during melting process, due to the isolated electrode pattern, so that the pixel electrode can be connected to the spare line. In a case that thicknesses of the pixel electrode blocks and the gate insulating layer are sufficient to connect the pixel electrode block and the gate line together after the gate insulating layer material is melted, the isolated electrode pattern is not an essential element, i.e., the common electrode material at the tooling hole may be hollowed out.

In another aspect, a method for manufacturing an array substrate is provided, which may be used for manufacturing the array substrate provided by the first embodiment or the second embodiment. The method may include:

forming the gate line pattern and the data line pattern on the base substrate, and the gate insulating layer pattern between the gate line pattern and the data line pattern; and forming the spare line pattern on a same layer as the gate line pattern. The spare line pattern may include a plurality of spare lines which are substantially in parallel with the gate lines in the gate line pattern, respective spare lines may be arranged at a plurality of rows of pixels defined by the gate line pattern and the data line pattern, and the respective spare lines and respective data lines in the data line pattern may have respective vertically overlapped regions.

The array substrate manufactured by the method for manufacturing the array substrate provided by the disclosure may repair a data line disconnection defect rapidly when the defect occurs in the array substrate.

In a particular implementation, when the above manufacture method is used for manufacturing the array substrate of the second embodiment, the spare line pattern may be formed by a same process as that of forming the gate line pattern.

In addition, the method may further include: forming the isolated electrode pattern by a same process as that of forming the common electrode pattern.

Accordingly, complexity of the manufacture process may be reduced by doing so.

Hereinafter, a process for manufacturing the array substrate of the second embodiment will be described briefly in connection with FIGS. 7-9

Figure 7:
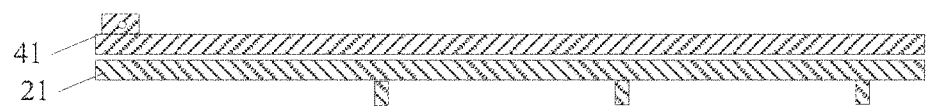
FIGS. 7-9 are flowcharts of manufacture methods of an array substrate provided by the second embodiment of the present disclosure.
Figure 7:
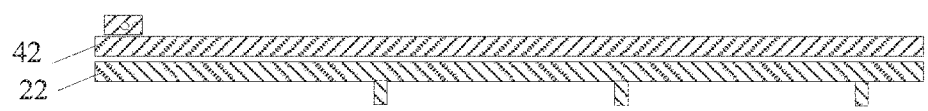
Figure 7:
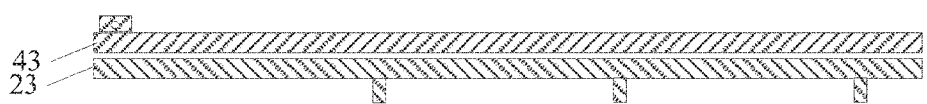
Figure 8:
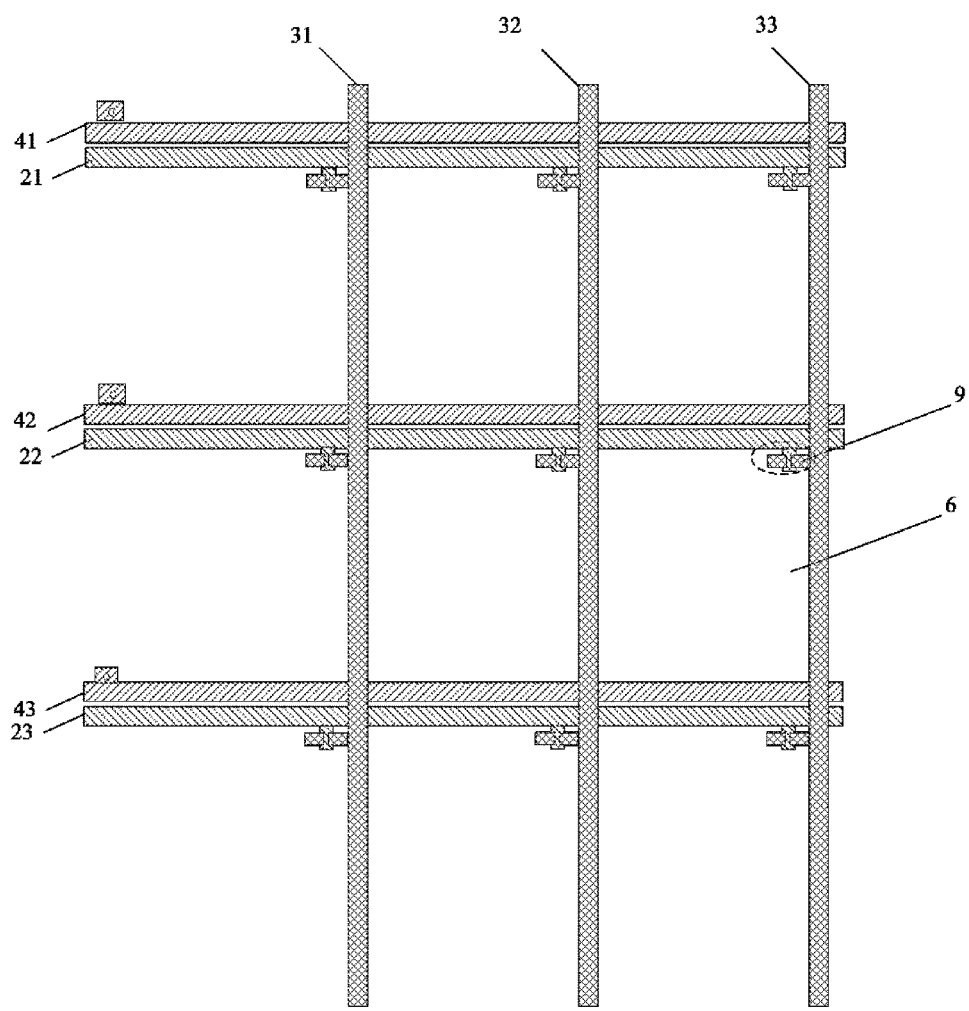
Figure 9:
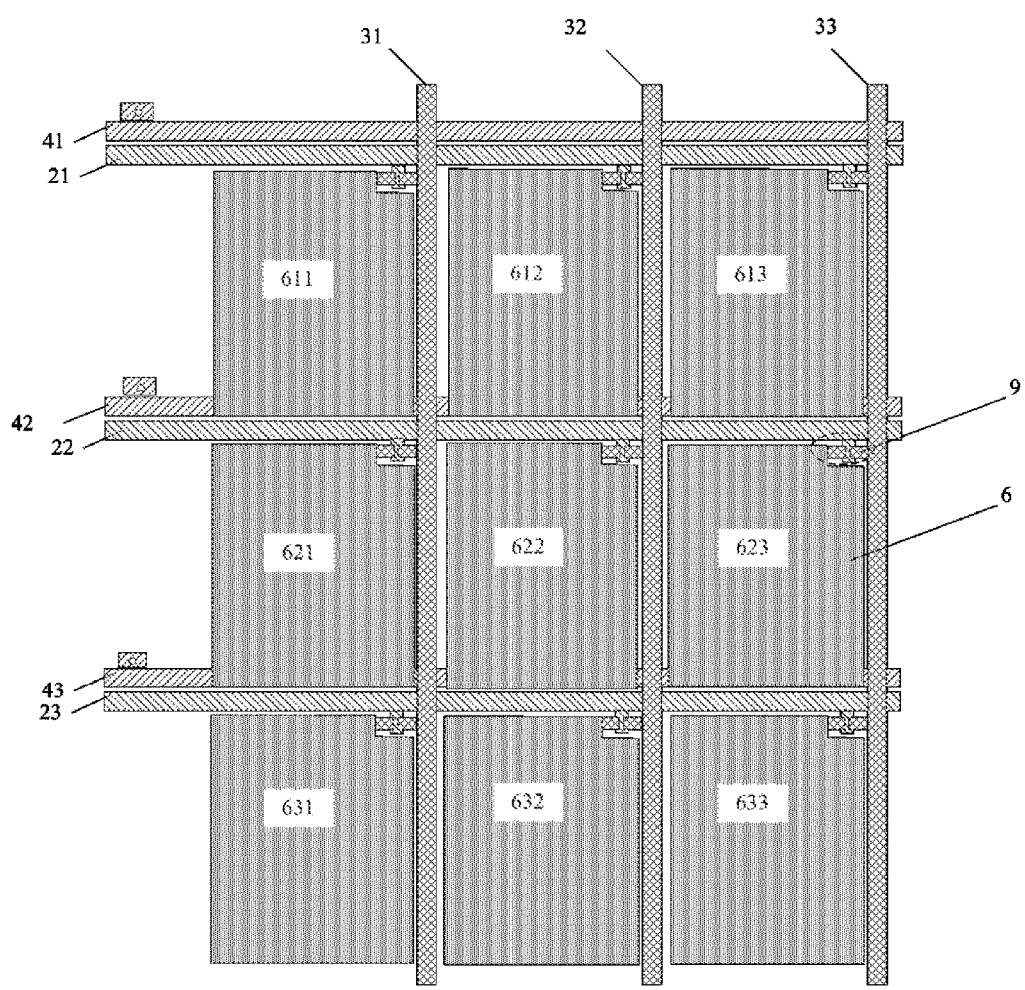

Step S1: as shown in FIG. 7, forming the gate line pattern and the data line pattern on the base substrate 1, the gate line pattern including a plurality of gate lines 21, 22, 23, and the spare line pattern including a plurality of spare lines 41, 42, 43;

Step S2: as shown in FIG. 8, forming the gate insulating layer 5 over the gate line pattern and the spare line pattern, and forming an active layer pattern over the gate insulating layer 5, which is a case in which the active layer pattern has been formed (the gate insulating layer 5 and the active layer pattern being not shown); and forming a source/drain electrode pattern and the data line pattern, the data line pattern including a plurality of data lines 31, 32, 33, and the source/drain electrode pattern including multiple sets of source and drain electrodes; as such, forming the TFT structure 9;

Step S3: as shown in FIG. 9, forming pixel electrode pattern, and the source/drain electrode in the source/drain electrode pattern is connected with a corresponding pixel electrode block in the pixel electrode pattern; and Step S4: forming the passivation layer pattern 7 on the pixel electrode pattern, where the tooling hole indicated by a sign "A" (not shown in FIG. 9) is formed on the passivation layer pattern at a position over the spare line; and forming the common electrode pattern 8 and the isolated electrode pattern 10 over the passivation layer pattern, where the isolated electrode pattern is filled into the tooling hole indicated by a sign "A", and is connected to the corresponding pixel electrode through the tooling hole indicated by a sign "A". The structure of the array substrate obtained after step S4 may be shown in FIG. 6.

In yet another aspect, a display device is also provided by the present disclosure. The display device may include the array substrate according to any of the embodiments as described above. In particular, the display device may be a mobile phone, a computer, a TV, a tablet, and any other devices with a display function.

The forgoing description of the embodiments has been provided for purposed of illustration and description. It is not intended to be exhaustive or to limit to that particular embodiment, but, where applicable, are interchangeable and can be used in a selected embodiment, even of not specifically shown or described. The same may also be varied in many ways. Such variations are not to be regarded as a departure from the disclosure, and all such modifications are intended to be included within the scope of the disclosure.

What is claimed is:

1. An array substrate, comprising:
    a base substrate;
    a gate line pattern and a data line pattern formed on the base substrate;
    a gate insulating layer pattern formed between the gate line pattern and the data line pattern;
    a spare line pattern formed on a same layer as the gate line pattern;
    a pixel electrode pattern formed on the gate insulating layer pattern; and
    a passivation layer pattern formed on the pixel electrode pattern,
    wherein the spare line pattern comprises a plurality of spare lines which are substantially in parallel with the gate lines in the gate line pattern, respective spare lines are arranged at a plurality of rows of pixels defined by the gate line pattern and the data line pattern, and the respective spare lines and respective data lines in the data line pattern have respective vertically overlapped regions;
    wherein the respective spare lines in the spare line pattern and corresponding pixel electrode blocks in the pixel electrode pattern located over the respective spare lines have respective vertically overlapped regions, and one or more tooling holes are formed on the passivation layer pattern at positions corresponding to the respective vertical overlapped regions; and
    wherein the array substrate further comprises an isolated electrode pattern formed over the passivation layer pattern, and one or more isolated electrodes in the isolated electrode pattern are connected to the corresponding pixel electrode blocks under the isolated electrode pattern via the one or more corresponding tooling holes.

2. The array substrate of claim 1, wherein each of the spare lines is arranged at each of the plurality of rows of pixels defined by the gate line pattern and the data line pattern.

3. A method of repairing the array substrate according to claim 1, wherein
when one data line in the array substrate is disconnected and is required to be repaired, the gate insulating layer at a vertically overlapped region between a segment of data line of the disconnected one data line which is not connected to a data driven circuit and a spare line which has a vertically overlapped region with the segment of data line and is closest to the data driven circuit is melted, and the gate insulating layer at a vertically overlapped region between the spare line and one adjacent data line which is adjacent to the disconnected one data line is melted, so that the segment of data line is connected to the adjacent data line via the spare line.

4. The method of claim 3, wherein
when one data line and one gate line are short-circuited, the data line is melted from a short circuit point, so that the data line is divided into two segments which are not connected to the gate line, and the two segments are processed according to processing steps performed when the data line is disconnected.

5. The array substrate of claim 1, wherein
the array substrate further comprises a common electrode pattern formed over the passivation layer pattern; and
the respective spare lines in the spare line pattern extend to a bezel region of the array substrate and are exposed at the bezel region.

6. The array substrate of claim 5,
wherein respective isolated electrodes in the isolated electrode pattern are isolated from common electrodes in the common electrode pattern.

7. The array substrate of claim 5, wherein the spare lines in the spare line pattern each comprises a spare line main body and a conductive strip connected to the spare line main body, the conductive strip being located at the bezel region and being exposed at the bezel region.

8. A method of testing the array substrate according to claim 5, wherein
when one pixel in the array substrate is required to be tested, gate insulating layer material at the tooling hole of the pixel is melted, so that the pixel electrode at the tooling hole of the pixel is connected to the spare line under the pixel electrode.

9. A method for manufacturing an array substrate, the array substrate comprising: a base substrate; a gate line pattern and a data line pattern formed on the base substrate; a gate insulating layer pattern formed between the gate line pattern and the data line pattern; a spare line pattern formed in a same layer as the gate line pattern;
a pixel electrode pattern formed on the gate insulating layer pattern; and a passivation layer pattern formed on the pixel electrode pattern,
the method comprising:
forming the gate line pattern and the data line pattern on the base substrate, and the gate insulating layer pattern between the gate line pattern and the data line pattern; and
forming the spare line pattern on a same layer as the gate line pattern, wherein the spare line pattern comprises a plurality of spare lines which are substantially in parallel with the gate lines in the gate line pattern, respective spare lines are arranged at a plurality of rows of pixels defined by the gate line pattern and the data line pattern, and the respective spare lines and respective data lines in the data line pattern have respective vertically overlapped regions, wherein the respective spare lines in the spare line pattern and corresponding pixel electrode blocks in the pixel electrode pattern located over the respective spare lines have respective vertically overlapped regions, and one or more tooling holes are formed on the passivation layer pattern at positions corresponding to the respective vertical overlapped regions; and
wherein the array substrate further comprises an isolated electrode pattern formed over the passivation layer pattern, and one or more isolated electrodes in the isolated electrode pattern are connected to the corresponding pixel electrode blocks under the isolated electrode pattern via the corresponding tooling holes.

10. The method of claim 9, wherein the step of forming the spare line pattern on the same layer as the gate line pattern comprises: forming the spare line pattern by a same process as that of forming the gate line pattern.

11. The method of claim 9, wherein the array substrate further comprises a common electrode pattern formed over the passivation layer pattern,
the method further comprises:
forming the isolated electrode pattern by a same process as that of forming the common electrode pattern.

12. A display device comprising an array substrate, the array substrate comprising:
a base substrate;
a gate line pattern and a data line pattern formed on the base substrate;
a gate insulating layer pattern formed between the gate line pattern and the data line pattern;
a spare line pattern formed on a same layer as the gate line pattern;
a pixel electrode pattern formed on the gate insulating layer pattern; and
a passivation layer pattern formed on the pixel electrode pattern,
wherein the spare line pattern comprises a plurality of spare lines which are substantially in parallel with the gate lines in the gate line pattern, respective spare lines are arranged at a plurality of rows of pixels defined by the gate line pattern and the data line pattern, and the respective spare lines and respective data lines in the data line pattern have respective vertically overlapped regions;
wherein the respective spare lines in the spare line pattern and corresponding pixel electrode blocks in the pixel electrode pattern located over the respective spare lines have respective vertically overlapped regions, and one or more tooling holes are formed on the passivation layer pattern at positions corresponding to the respective vertical overlapped regions; and
wherein the array substrate further comprises an isolated electrode pattern formed over the passivation layer pattern, and one or more isolated electrodes in the isolated electrode pattern are connected to the corresponding pixel electrode blocks under the isolated electrode pattern via the corresponding tooling holes.

13. The display device of claim 12, wherein each of the spare lines is arranged at each of the plurality of rows of pixels defined by the gate line pattern and the data line pattern.

14. The display device of claim 12, wherein
the array substrate is a High Aperture ADvanced Super Dimension Switch (H-ADS) array substrate.

15. The display device of claim 12, wherein
and
the respective spare lines in the spare line pattern extend to a bezel region of the array substrate and are exposed at the bezel region.

16. The display device of claim 15,
wherein respective isolated electrodes in the isolated electrode pattern are isolated from common electrodes in a common electrode pattern formed over the passivation layer pattern.

17. The display device of claim 15, wherein the spare lines in the spare line pattern each comprises a spare line main body and a conductive strip connected to the spare line main body, the conductive strip being located at the bezel region and being exposed at the bezel region.

18. The display device of claim 15, wherein
when one pixel in the array substrate is required to be tested, gate insulating layer material at the tooling hole of the pixel is melted, so that the pixel electrode at the tooling hole of the pixel is connected to the spare line under the pixel electrode.

19. The display device of claim 12, wherein
when one data line in the array substrate is disconnected and is required to be repaired, the gate insulating layer at a vertically overlapped region between a segment of data line of the disconnected one data line which is not connected to a data driven circuit and a spare line which has a vertically overlapped region with the segment of data line and is closest to the data driven circuit is melted, and the gate insulating layer at a vertically overlapped region between the spare line and one adjacent data line which is adjacent to the disconnected one data line is melted, so that the segment of data line is connected to the adjacent data line via the spare line.

20. The display device of claim 19, wherein
when one data line and one gate line are short-circuited, the data line is melted from a short circuit point, so that the data line is divided into two segments which are not connected to the gate line, and the two segments are processed according to processing steps performed when the data line is disconnected.

* * * * *